United States Patent
Blank et al.

(10) Patent No.: US 8,796,764 B2
(45) Date of Patent: Aug. 5, 2014

(54) SEMICONDUCTOR DEVICE COMPRISING TRENCH GATE AND BURIED SOURCE ELECTRODES

(75) Inventors: Oliver Blank, Nittendorf (DE); Uli Hiller, Bad Abbach (DE)

(73) Assignee: Infineon Technologies Austria AG, Villach (AT)

( * ) Notice: Subject to any disclaimer, the term of this patent is extended or adjusted under 35 U.S.C. 154(b) by 627 days.

(21) Appl. No.: 12/242,195

(22) Filed: Sep. 30, 2008

(65) Prior Publication Data

US 2010/0078718 A1    Apr. 1, 2010

(51) Int. Cl.
*H01L 29/66* (2006.01)

(52) U.S. Cl.
USPC .... 257/331; 257/328; 257/333; 257/E27.091; 257/E29.257

(58) Field of Classification Search
CPC .............. H01L 29/7813; H01L 29/407; H01L 29/66734; H01L 29/41766; H01L 29/4236; H01L 29/66348
USPC ........... 257/333, E27.091, E29.257, 331, 328
See application file for complete search history.

(56) References Cited

U.S. PATENT DOCUMENTS

| | | |
|---|---|---|
| 5,731,218 A | 3/1998 | Melzner et al. |
| 6,525,372 B2 | 2/2003 | Baliga |
| 6,621,121 B2 | 9/2003 | Baliga |
| 2004/0089910 A1 * | 5/2004 | Hirler et al. ................... 257/500 |
| 2005/0167744 A1 * | 8/2005 | Yilmaz ......................... 257/329 |
| 2006/0141739 A1 * | 6/2006 | Poelzl .......................... 438/424 |
| 2006/0145230 A1 * | 7/2006 | Omura et al. ................ 257/302 |
| 2006/0289929 A1 * | 12/2006 | Andrews ..................... 257/330 |
| 2007/0059887 A1 * | 3/2007 | Poelzl et al. ................. 438/270 |
| 2007/0114600 A1 * | 5/2007 | Hirler et al. ................. 257/330 |
| 2007/0126055 A1 * | 6/2007 | Hueting et al. .............. 257/330 |
| 2007/0187753 A1 * | 8/2007 | Pattanayak et al. .......... 257/330 |
| 2008/0128803 A1 * | 6/2008 | Hirler et al. ................. 257/331 |
| 2008/0150013 A1 * | 6/2008 | Tai et al. ...................... 257/330 |
| 2009/0218618 A1 * | 9/2009 | Blank et al. ................. 257/331 |

* cited by examiner

*Primary Examiner* — Anthony Ho
*Assistant Examiner* — David Chen
(74) *Attorney, Agent, or Firm* — Dicke, Billig & Czaja, PLLC

(57) ABSTRACT

A semiconductor device includes a semiconductor substrate, a trench, a buried insulated source electrode arranged in a bottom portion of the trench, a first gate electrode and a second gate electrode arranged in an upper portion of the trench and spaced apart from one another. A surface gate contact extends into the upper portion of the trench and is in physical and electrical contact with the first gate electrode and second gate electrode.

13 Claims, 15 Drawing Sheets

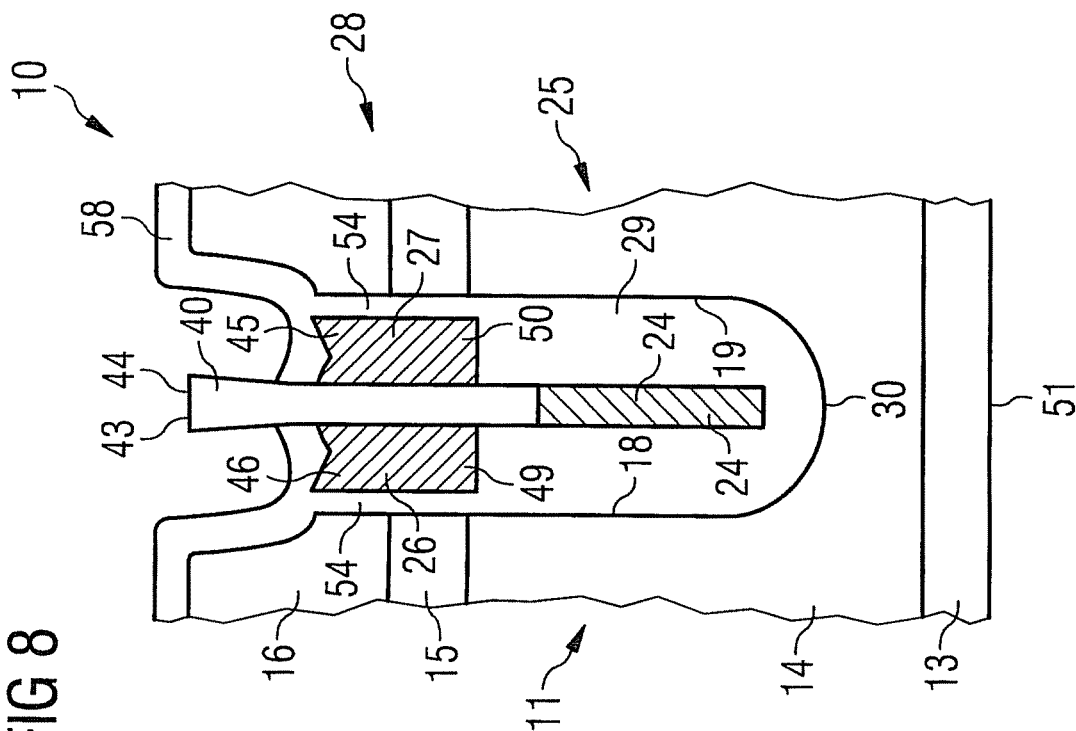
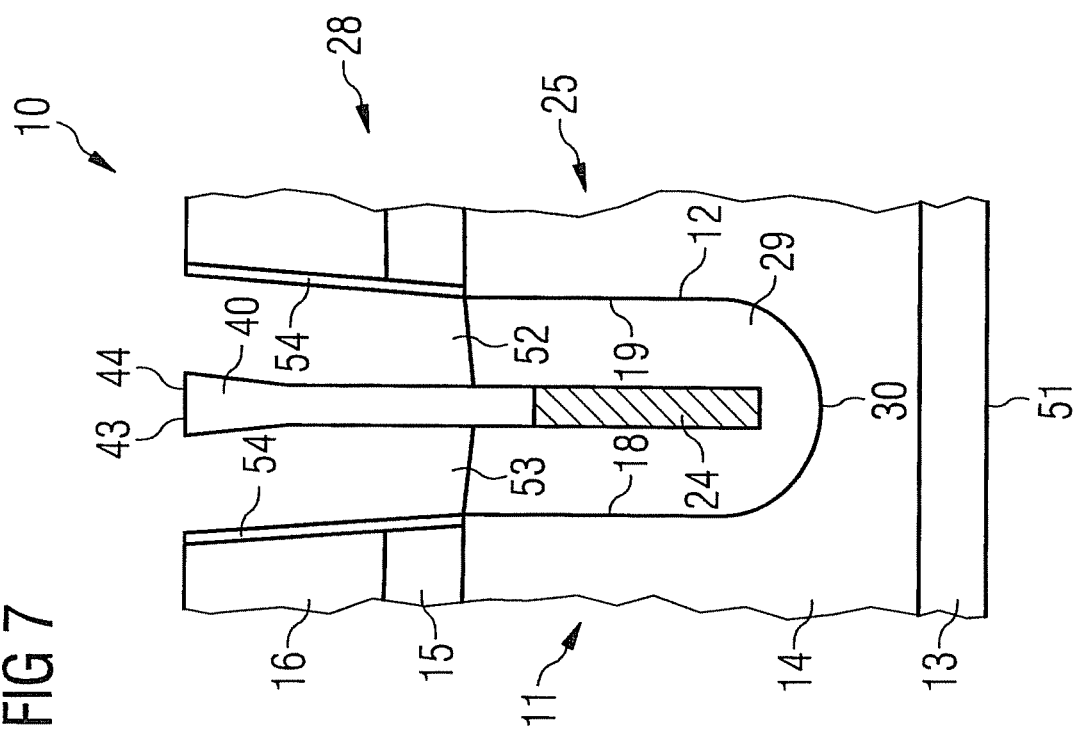

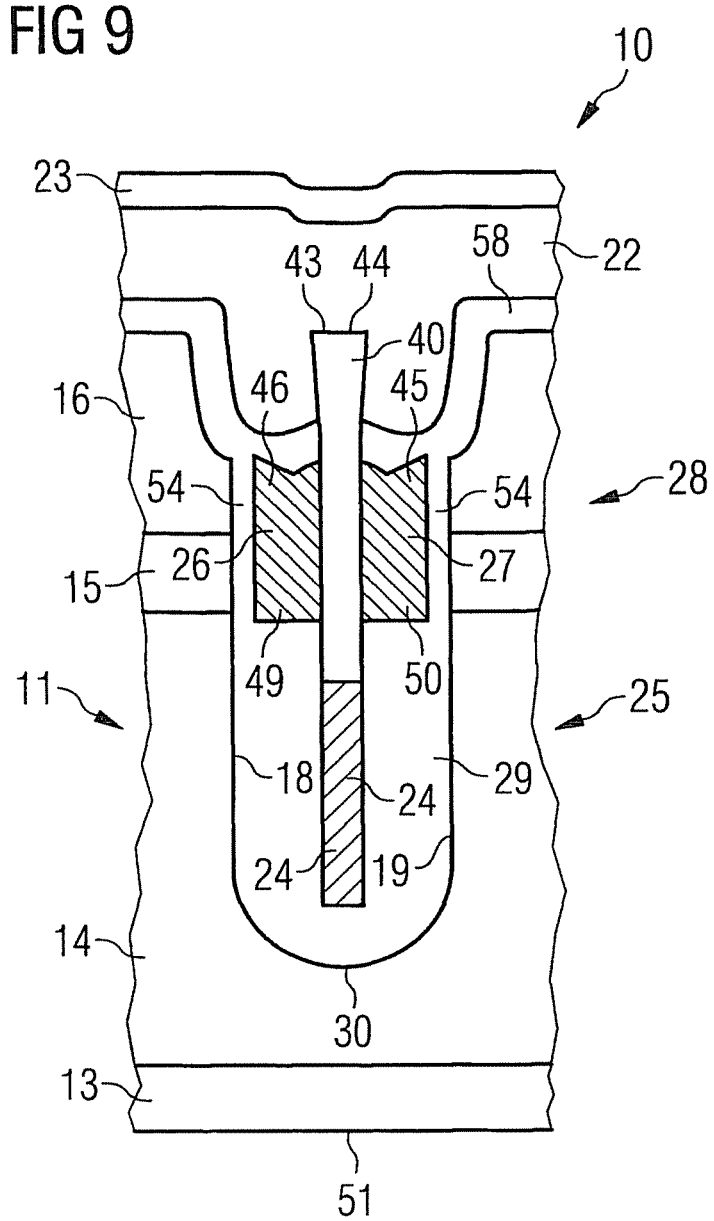

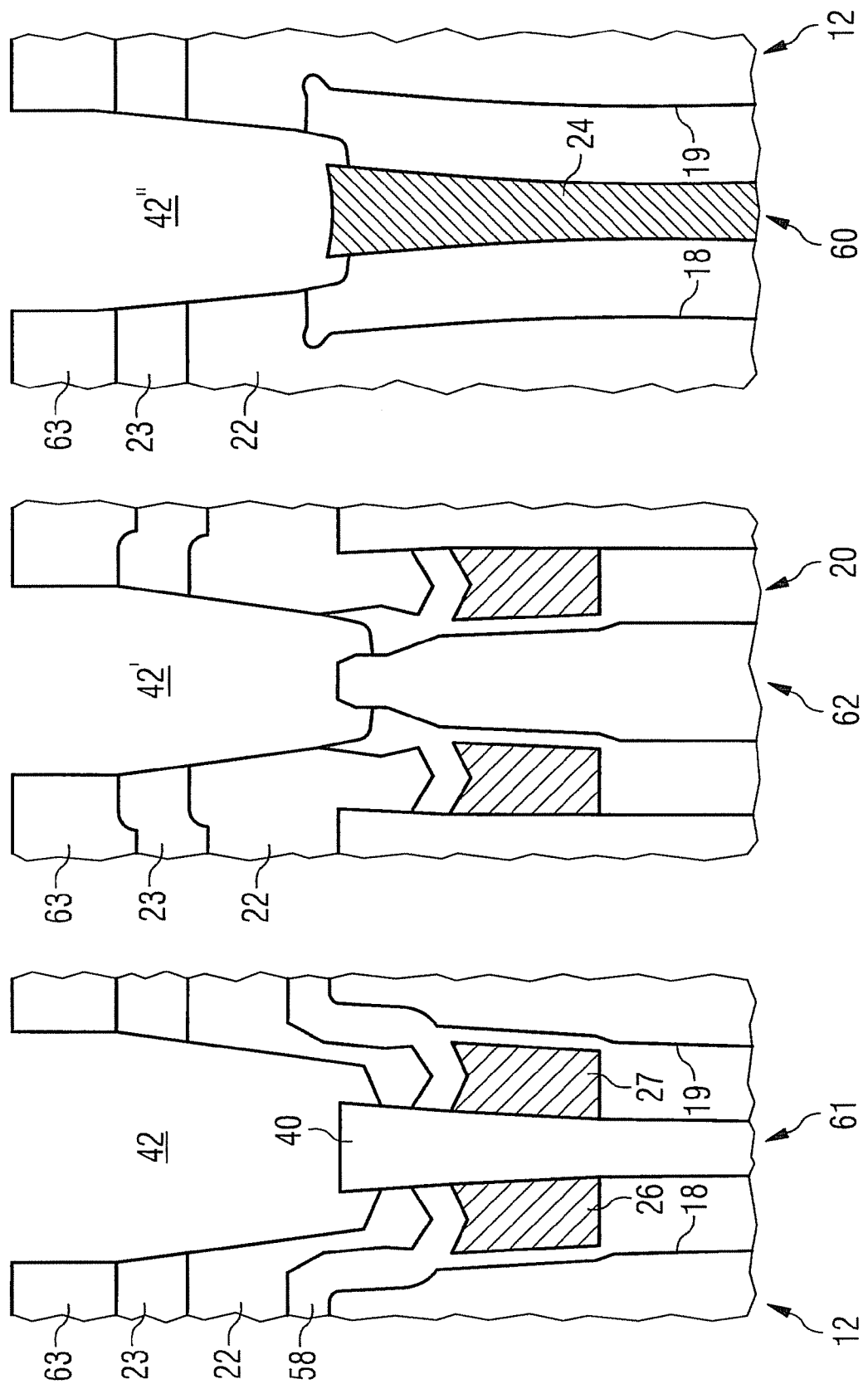

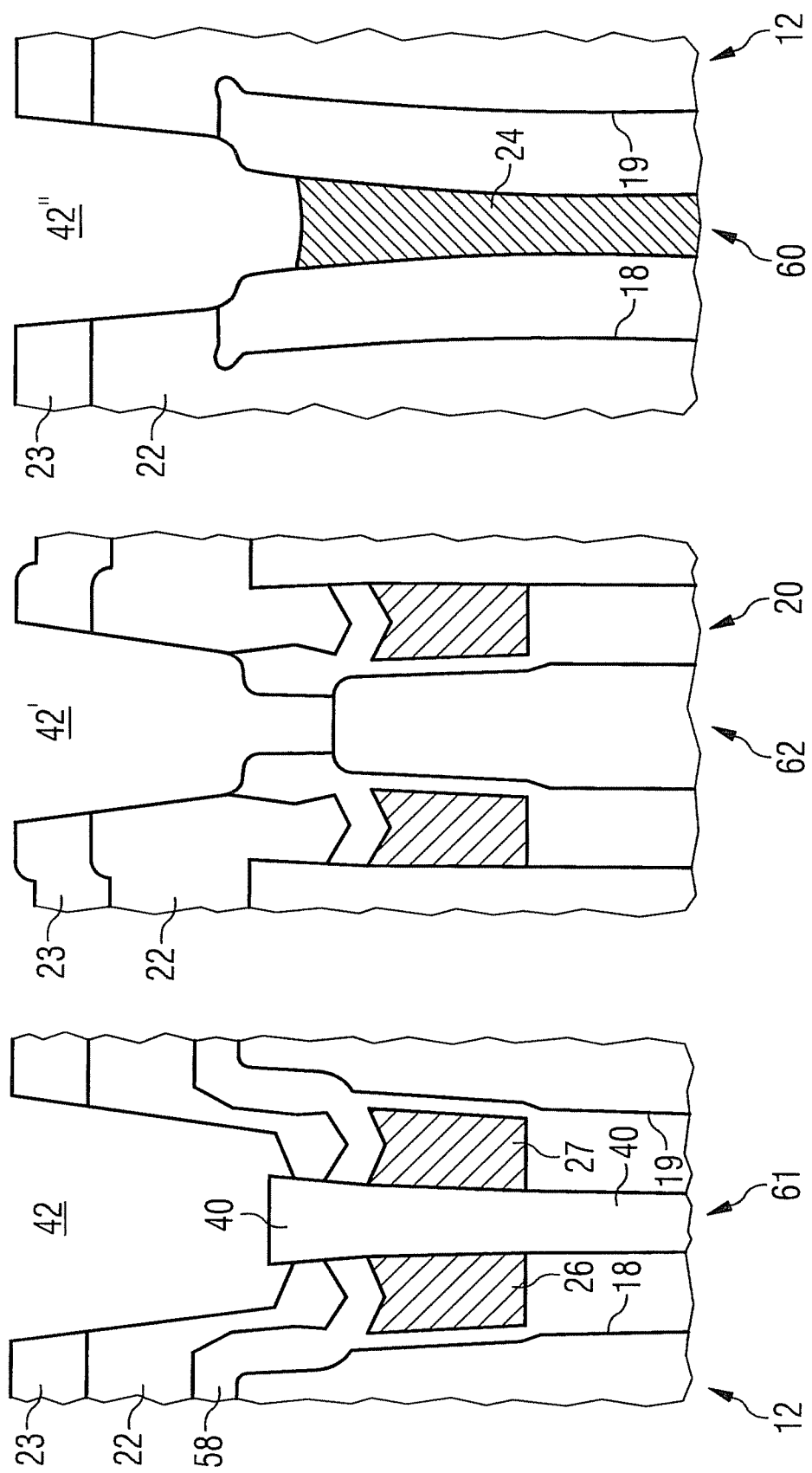

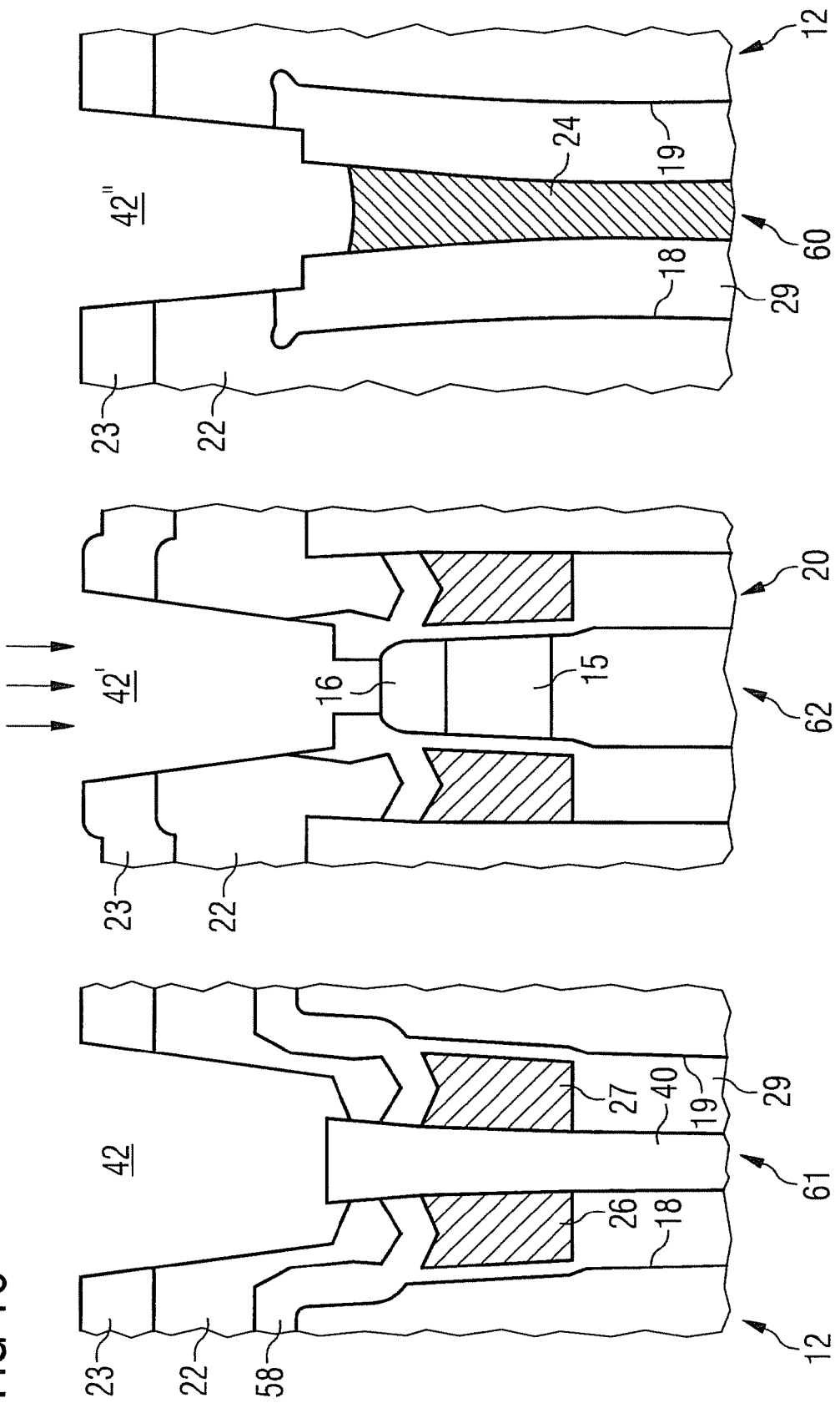

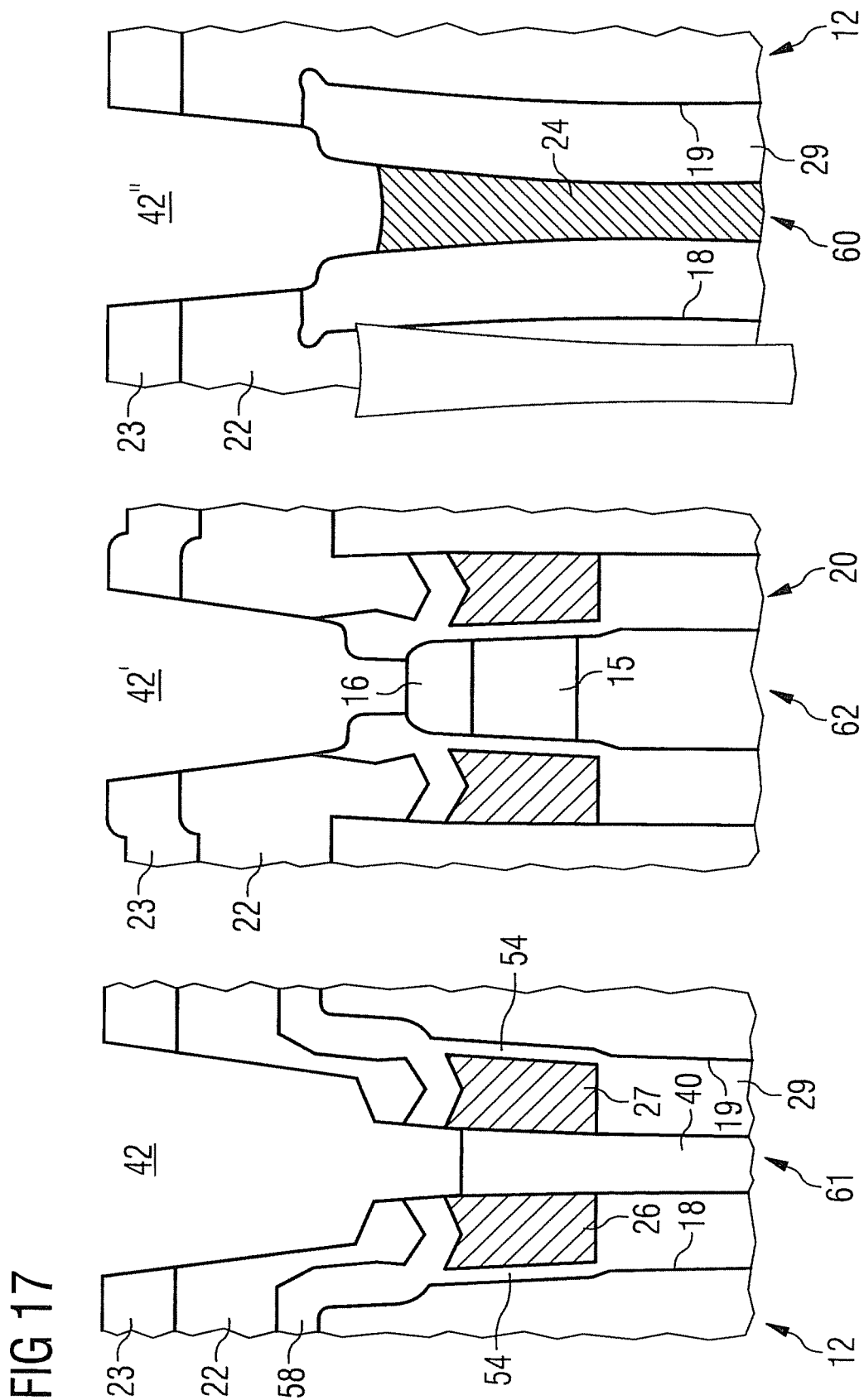

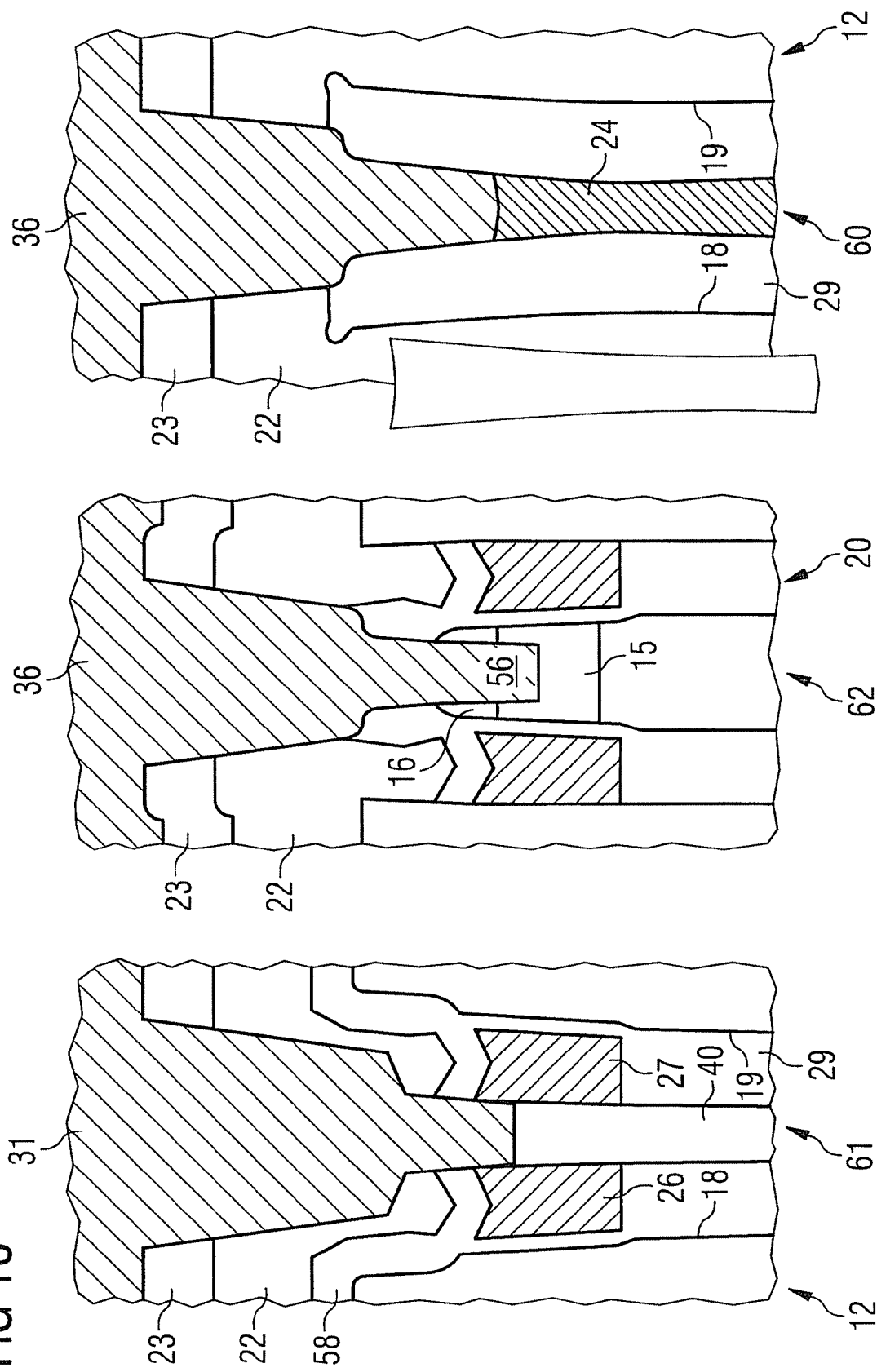

SEMICONDUCTOR DEVICE COMPRISING TRENCH GATE AND BURIED SOURCE ELECTRODES

BACKGROUND

A semiconductor device may include a substrate of a semiconductor material, for example silicon or GaAs, and a surface metallization which is electrically connected to doped regions of the substrate by a rewiring structure. The rewiring structure typically has a number of electrically conductive layers separated by dielectric layers including electrically conductive through contacts. The rewiring structure as well as the doped regions within the substrate are typically fabricated using a number of masking, doping, deposition and etching processes.

For these and other reasons, there is a need for the present invention.

SUMMARY

A semiconductor device includes a semiconductor substrate, a trench, a buried insulated source electrode arranged in a bottom portion of the trench and first and second gate electrodes arranged in an upper portion of the trench and spaced apart from one another. A surface gate contact extends into the upper portion of the trench and is in physical and electrical contact with the first and second gate electrodes.

A method includes providing a semiconductor substrate having a trench. A buried insulated source electrode is arranged in a bottom of the trench and at least one gate electrode is arranged in an upper portion of the trench. The trench further includes a spacer extending from the buried insulated source electrode to the gate electrode and having a portion exposed in the open end of the trench. The spacer is selectively removed from the trench exposing at least a portion of the gate electrode. An electrically conductive material is deposited into the trench to form a contact to the gate electrode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a trench of a semiconductor device including a buried insulated source electrode, a spacer and a gate electrode.

FIG. 5 illustrates selective removal of the spacer of FIG. 4 to expose at least a region of the gate electrode.

FIG. 6 illustrates the deposition of conductive material to produce a self-aligned gate contact.

FIGS. 7 to 9 illustrate the production of a gate electrode in a trench of a semiconductor device.

FIG. 7 illustrates the selective removal of an oxide arranged in a trench of a semiconductor device including a buried insulated source electrode and a spacer.

FIG. 8 illustrates the deposition of the gate electrode.

FIG. 9 illustrates the deposition of the dielectric layers onto the gate electrode.

FIG. 10 illustrates the production of a through hole in an intermediate oxide layer to expose regions of the underlying mesa and trench.

FIG. 11 illustrates the selective removal of the spacer arranged in the trench and of the mesa.

FIG. 12 illustrates the deposition of electrically conductive material to produce a self-aligned gate contact and a self-aligned source contact.

FIGS. 13 to 18 illustrate the production of surface contacts in three different regions of a semiconductor device.

FIG. 13 illustrates a plan view of a semiconductor device including a plurality of trenches.

FIG. 14 illustrates producing a contact hole in three different regions of the semiconductor device of FIG. 13.

FIG. 15 illustrates the selective etching of the mesa and buried source electrode.

FIG. 16 illustrates the implantation of the mesa.

FIG. 17 illustrates the selective removal of the spacer.

FIG. 18 illustrates the production of the surface contacts.

DETAILED DESCRIPTION

Figure 1:
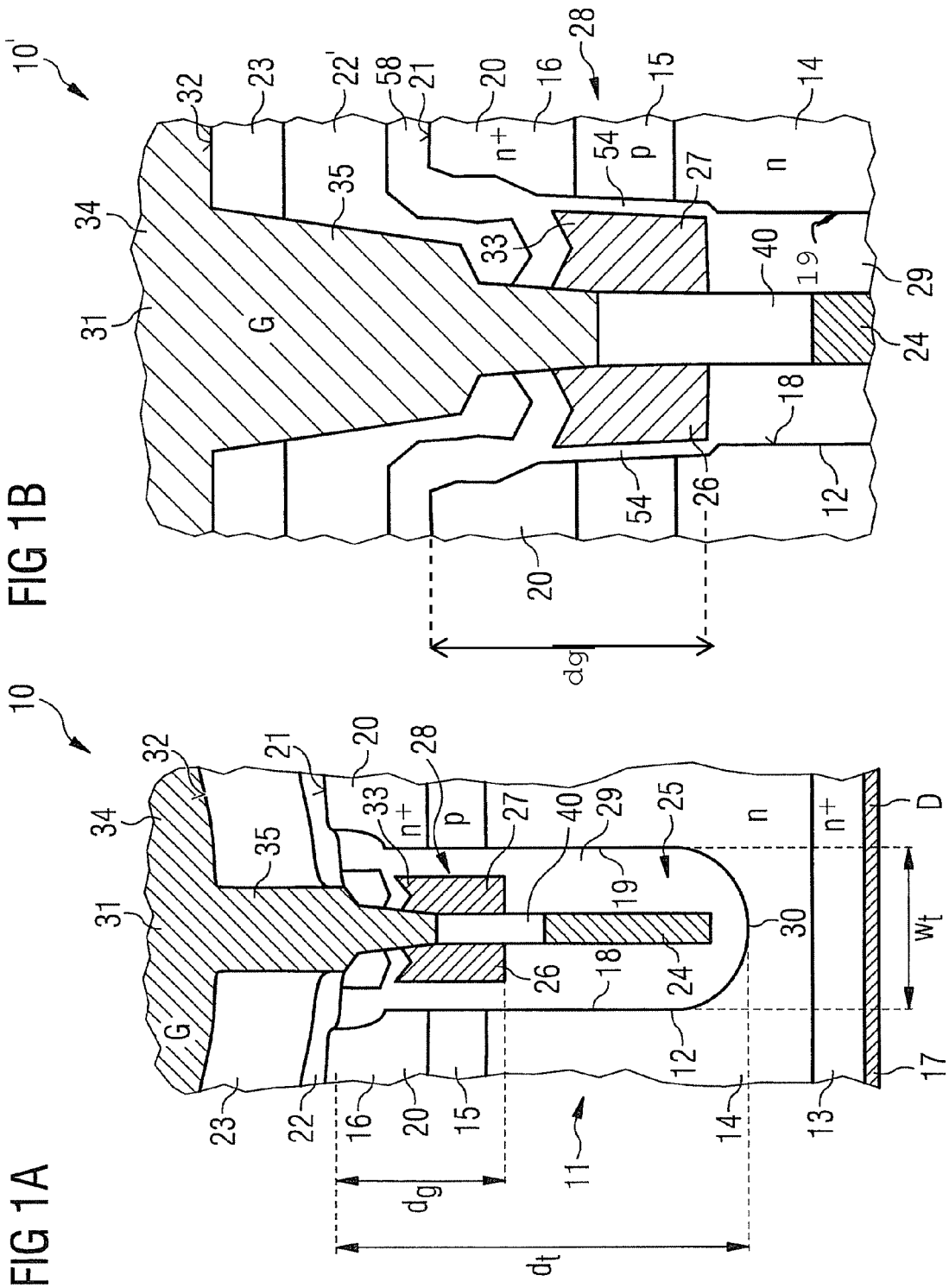
FIG. 1A illustrates a first cross-sectional view of a semiconductor device according to an embodiment.
FIG. 1B illustrates a cross-sectional view of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1A illustrates a cross-sectional view of a portion of a semiconductor device 10, according to an embodiment. The semiconductor device 10 includes a semiconductor substrate 11 and a trench 12. In particular, the semiconductor device 10 is a vertical MOSFET device with a trench structure. The MOSFET device is illustrated as a n-channel device with a voltage rating in the range of 60V to 300V. However, in further embodiments, the device is a p-channel device and/or the device has a voltage rating of a different range, for example 75V to 250V.

The substrate 11 of the semiconductor device 10 includes a rear side including a first layer 13 of a first conductivity type, in this embodiment, n+, providing a drain layer, a second layer 14 of the first conductivity type, in this embodiment n, arranged on the drain layer 13 and providing a drift layer, a third layer 15 of a second conductivity type, in this case p, complementary to the first conductivity type arranged on the second layer 14 and providing a body layer and a fourth highly doped layer 16 of the first conductivity type arranged on the third layer 15 and providing a source layer on the front side of the substrate 11. A drain metallization layer 17 is positioned on the drain layer 13 to provide the drain contact. The drain metallization includes one or more metallic layers.

Figure 12:
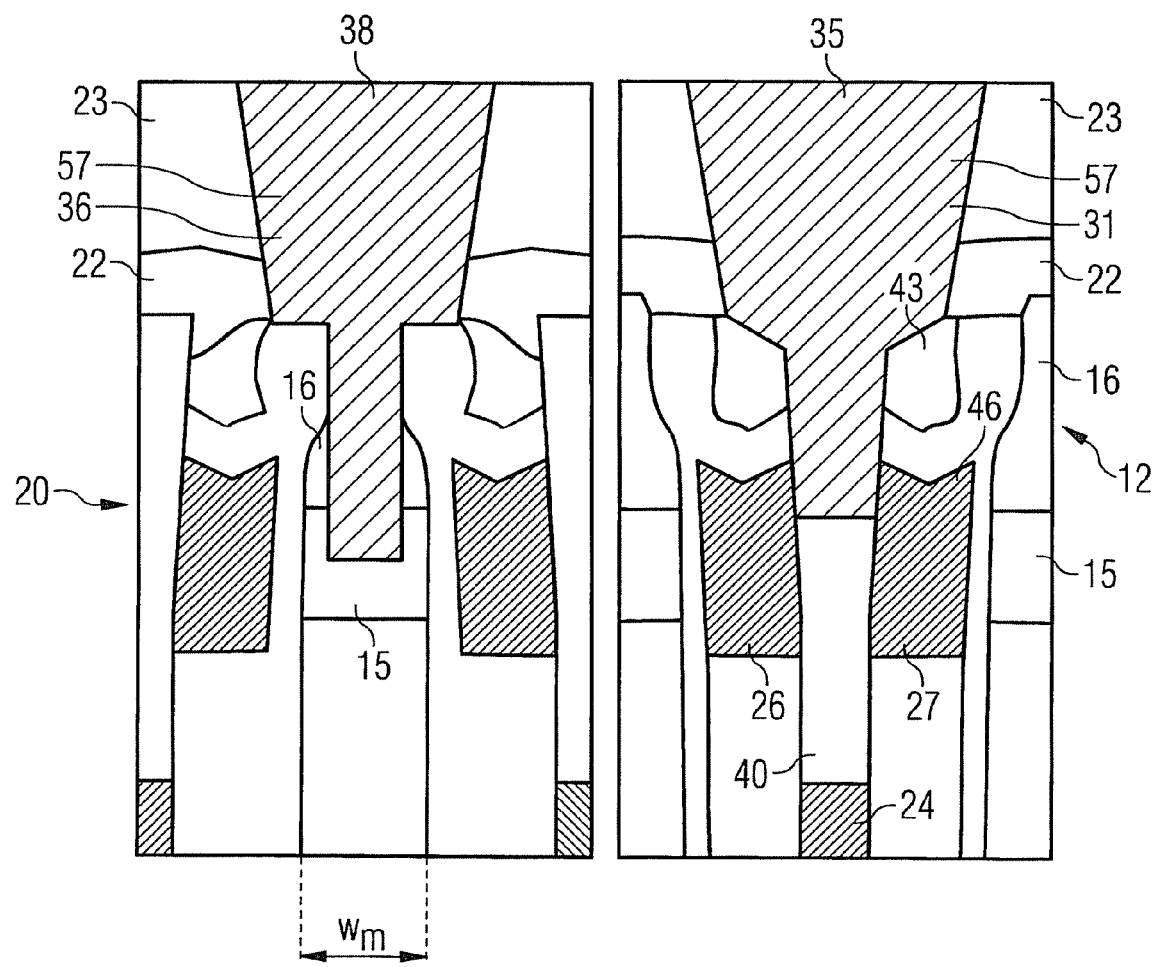

The trench 12 in the substrate illustrated in FIG. 1A is one of a plurality of trenches 12 which are not illustrated in the Figure. Each of the trenches 12 are defined by two side walls 18, 19 extending in a first direction and spaced apart from one another to define a trench width wt. In the view illustrated in FIG. 1A, the first direction extends perpendicularly into the page. The trenches 12 are separated from their immediate neighbor by a mesa 20 having a width $w_m$ as shown in FIG. 12. The trench 12 extends into the substrate 11 from the front side 21 of the substrate 11 and has a depth d, so that its base 30 is positioned in the second layer 14 of the substrate 11. A first dielectric layer 22 of USG (Undoped Silicon Glass) is arranged on the front side 21 of the substrate 11 and a second dielectric layer 23 of an oxide, also termed an intermediate oxide layer, is arranged on the first dielectric layer 22. However, other embodiments a single dielectric layer is used in place of the first dielectric layer 22 and second dielectric layer 23.

FIG. 1B illustrates a trench 12 of a semiconductor device 10'. The embodiment of FIG. 1B differs from the embodiment illustrated in FIG. 1A in the arrangement of the dielectric layer 22'. In the embodiment illustrated in FIG. 1B, the dielectric layer 22' is a TEOS (Tetra Ethyl Ortho Silane) layer 22' which fills the upper region of the trench 12 as well as extending over the upper surface 21 of the silicon substrate.

A source electrode 24 is arranged in a bottom portion of the trench 12 and a first gate electrode 26 and a second gate electrode 27 are arranged in an upper portion 28 of the trench 12. The first gate electrode 26 and the second gate electrode 27 are spaced apart from one another and arranged at approximately the same depth $d_g$ from the front side 21 within the trench 12.

Both the first gate electrode 26 and the second gate electrode 27 as well as the source electrode 24 extend lengthwise along substantially the entire depth d, as shown in FIG. 1A of the trench 12 within the region of the trench 12 which includes the gate oxide. The first gate electrode 26 and the second gate electrode 27 are not positioned in other regions of the trench 12, as is illustrated in FIG. 2, for example.

The source electrode 24 is insulated from the semiconductor substrate 11 by a layer of electrically insulating material 29, in this case silicon oxide, arranged on the side walls 18, 19 and base 30 shown in FIG. 1A of the trench 12. The source electrode 24 is also electrically insulated from the first gate electrode 26 and second gate electrode 27 arranged in the upper portion 28 of the trench 12. The source electrode 24 may be termed a buried insulated source electrode 24.

The view of FIGS. 1A and 1B illustrates a local portion of the trench 12 in which a surface gate contact 31 extends from the outermost surface 32 of the front side 21 of the semiconductor device 10 into the upper portion 28 of the trench 12 and is in physical and electrical contact with the first gate electrode 26 and with the second gate electrode 27. The first gate electrode 26 and the second gate electrode 27 provide gate wings of a single device gate electrode 33 since they are electrically connected to one another as well as the to the surface gate contact 31.

The surface gate contact 31 includes a layer portion 34 positioned on the surface 32 of the semiconductor device 10, in this case the surface is provided by an electrically insulating intermediate oxide layer 22, and a through contact portion 35 which extends through the intermediate oxide layer 22 into the trench 12 and makes physical and electrical contact to the first gate electrode 26 and the second gate electrode 27 positioned within the upper portion 28 of the trench 12. The layer portion 34 and through contact portion 35 of the surface gate contact 31 were fabricated during the same deposition process.

In the embodiment illustrated in FIGS. 1A and 1B the surface gate contact is metallic and has a non-illustrated multi-layer structure of Ti/TiN/W, titanium, Ti, being the bottommost layer. However, other electrically conductive materials such as poly-silicon are used in other embodiments.

In the case of a poly silicon plug, the portion indicated with reference number 35 in FIGS. 1A and 1B is poly silicon and the portion indicated with reference number 34 is metallic.

In this embodiment, each trench 12 has a single gate contact region as illustrated in FIGS. 1A and 1B. As an example, the gate contact regions may be provided at one end of the gate oxide area of each of the trenches 12 so that a single row of gate contacts is provided in an edge region of the semiconductor device 10. In other embodiments, a plurality of gate contacts to a single trench may be provided. The gate contacts may be distributed at intervals along the length of the trench 12.

Figure 2:
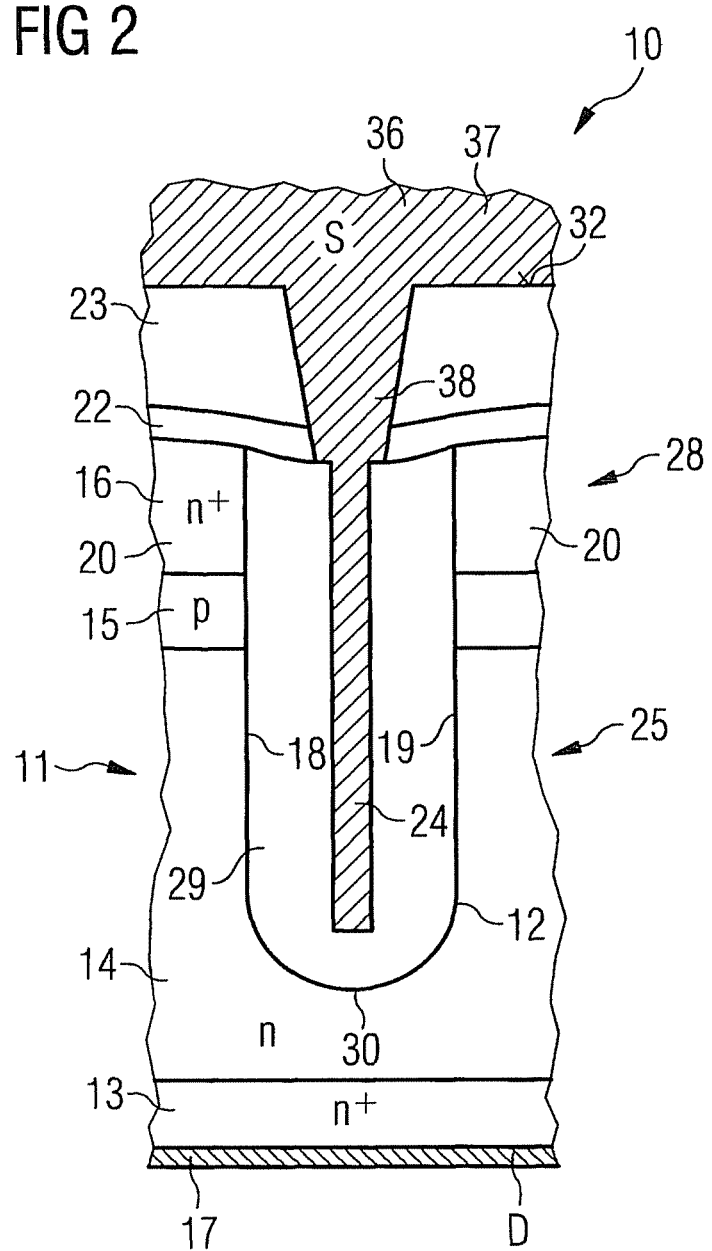
FIG. 2 illustrates a second cross-sectional view of the semiconductor device of FIG. 1A.
Figure 3:
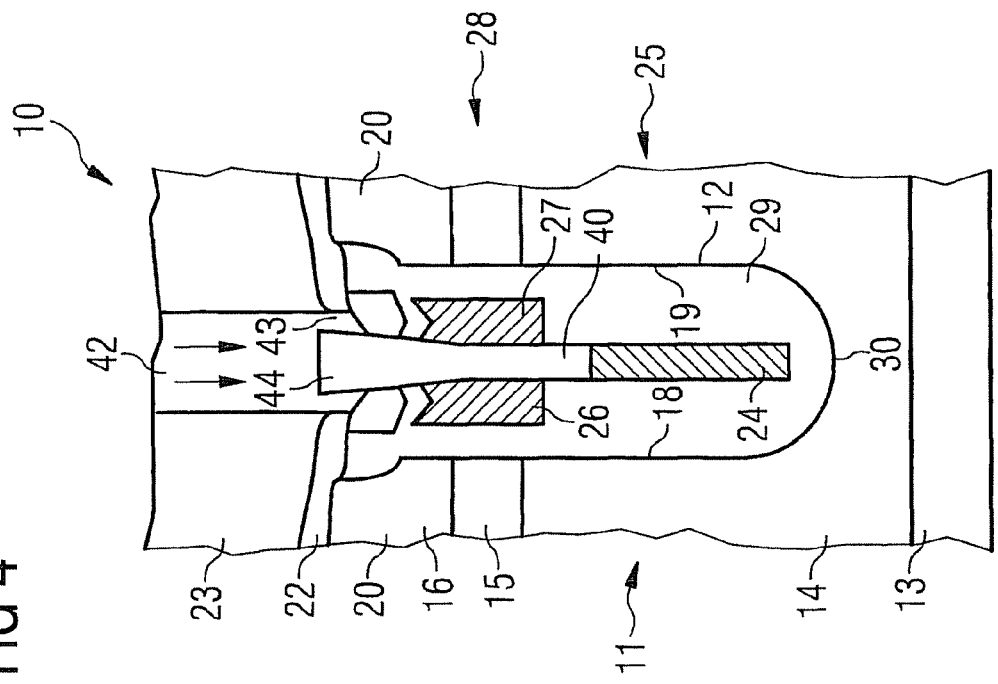
FIG. 3 illustrates a cross-sectional view of a semiconductor device according to an embodiment.

FIG. 2 illustrates a cross-sectional view of a region of the trench 12 at a different position along the length of the trench 12 which is adjacent the cross-sectional view of FIG. 1.

In the region of the trench 12 illustrated in FIG. 2, the surface gate contact 31 does not extend into the trench 12. In this region, a surface source contact 36 extends into the trench 12 and is electrically connected to the buried source electrode 24 arranged in the bottom portion 25 of the trench 12. The source contact 36 is a self-aligned contact and includes a layer portion 37 arranged on the outer surface 32 of the intermediate oxide layer 23 and a through contact portion 38 which extends from the surface portion, through the intermediate oxide layer 23, through the first dielectric layer 22 and into the upper portion 28 of the trench 12.

As illustrated in FIG. 2, the gate electrodes 26, 27 do not extend into the regions of the trench 12 outside of the gate oxide region. The region of the trench illustrated in FIG. 2 may be positioned at one end of the trench. The contact 36 may be a source finger.

The surface source contact 36 is arranged on the outermost surface 32 of the second dielectric layer 23 and is arranged in the same rewiring level as the surface gate contact 31 illustrated in FIGS. 1A and 1B.

These regions of the trench 12 outside of the gate contact region may also include a surface source contact electrically connected to the body regions positioned in the mesas. Typically a plurality of contacts distributed at intervals along the length of the trench between the surface source contact and the buried insulated source electrode and the body region of the mesas is provided.

As is illustrated in FIG. 1A and FIG. 1B, in at least the region of the trench 12 in which the surface gate contact 31 extends into the trench 12, the semiconductor device 10 further includes a spacer 40 positioned within the trench 12 which extends from the buried insulated source electrode 24 to the surface gate metal contact 31. The spacer 40 is arranged in the centre of the trench 12 and has lateral dimensions which correspond to those of the source electrode 24.

In this embodiment, the spacer 40 includes an electrically insulating material, in particular $Si_3N_4$, and is in physical contact with the buried source electrode 24, the first gate electrode 26 and the second gate electrode 27, the surface gate contact 31 and the electrically insulating material 29 arranged on the side walls 18, 19 of the trench 12. The upper portion of the spacer 40 extends between the first gate electrode 26 and second gate electrode 27 filling the space between them. The spacer 40 overlaps in the lower region of the first gate electrode 26 and second gate electrode 27.

Figure 4:
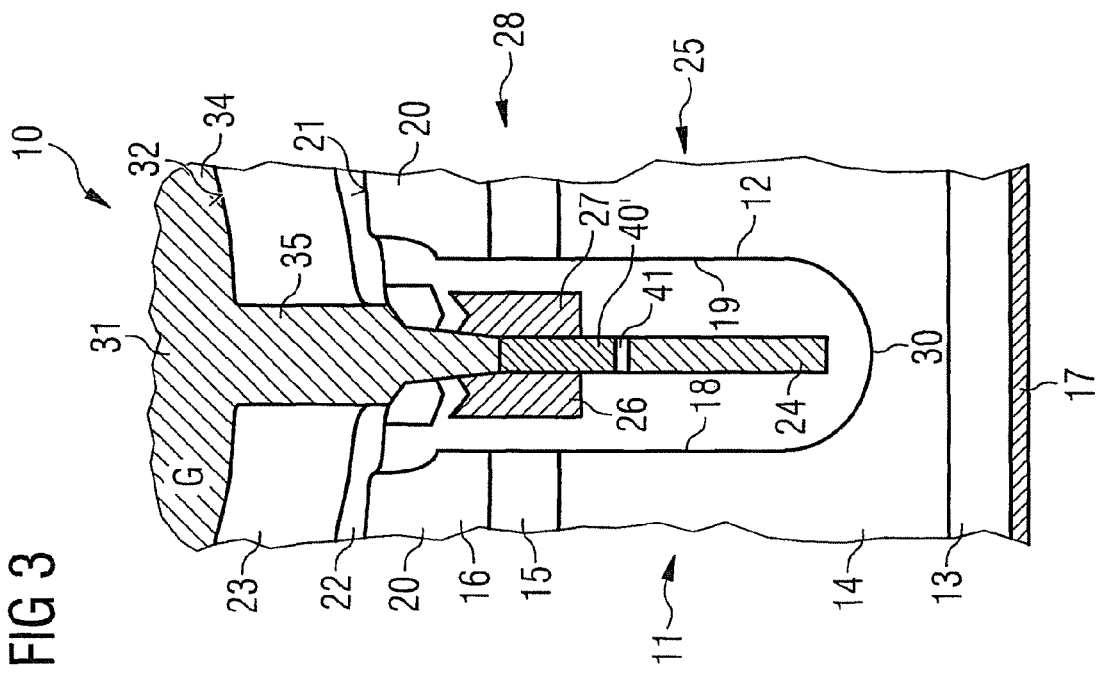
FIGS. 4 to 6 illustrate the production of a self-aligned gate contact.
Figure 5:
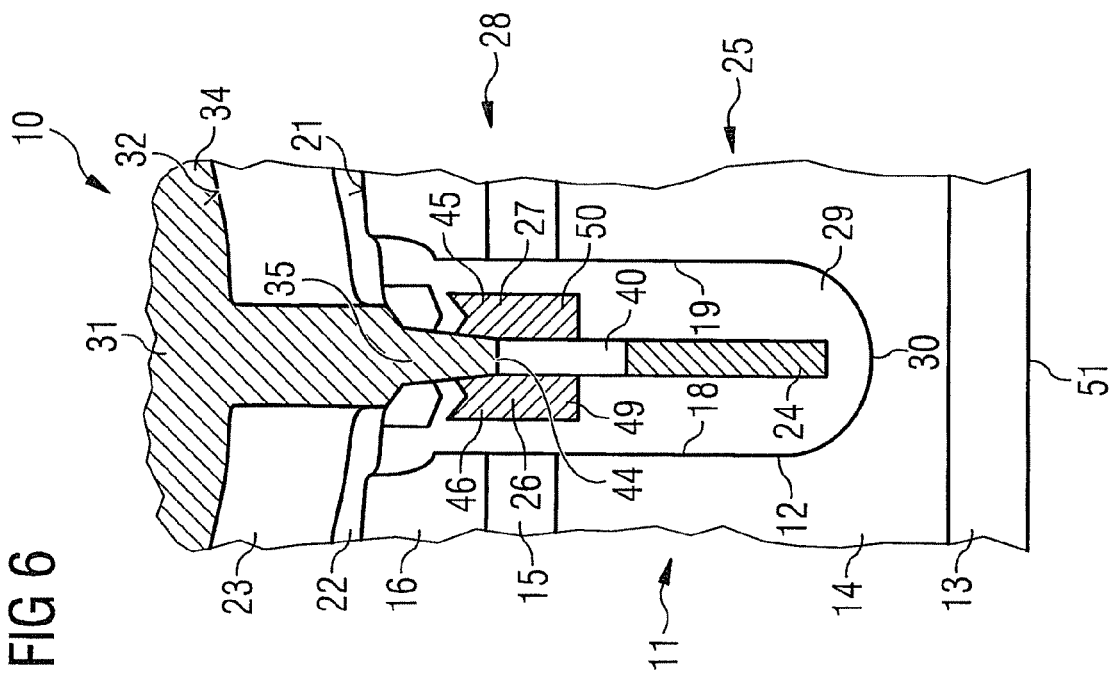
Figure 6:
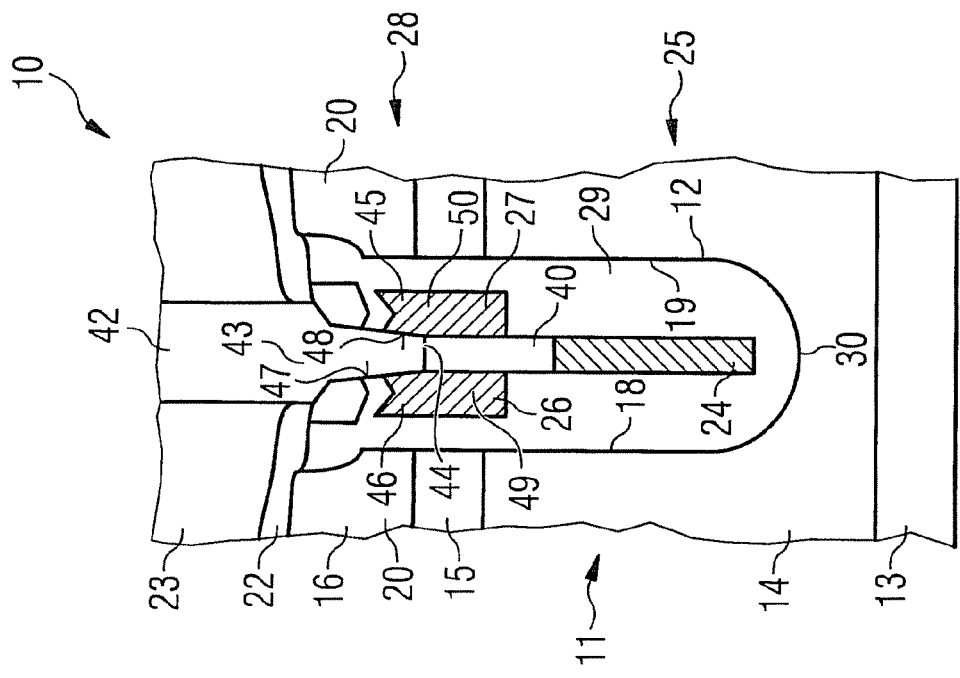

FIGS. 4 to 6 illustrate a method of providing a gate contact having the arrangement illustrated in FIG. 1A.

FIG. 4 illustrates a cross-sectional view of the semiconductor substrate 11 having a trench 12. A buried insulated source electrode 24 is arranged in a bottom 25 of the trench 12 and at least one gate electrode 26, 27 is arranged in an upper portion 28 of the trench 12. A through-hole 42 in the first dielectric layer 22 and the second dielectric layer 23 is positioned above this region of the trench 12 so that the upper end 43 of the trench 12 is exposed at the bottom of the through-hole 42. The trench 12 further includes a spacer 40 extending from the buried insulated source electrode 24 to the open end 43 of the trench 12. The uppermost portion 44 of the spacer 40 is exposed in the through-hole 42.

In this embodiment, the gate electrode includes two wings 26, 27 positioned on opposing sides of the spacer 40. In a method to produce a gate contact 31, an upper portion of the spacer 40 is selectively removed as indicated by the arrows from the trench 12 so as to expose at least a portion of the gate electrode 26, 27, in particular the upper portions 45, 46 of the first gate electrode 26 and second gate electrode 27. This is illustrated in FIG. 5.

The spacer 40 is selectively removed from the upper surface 21, reducing its height until a shallow trench 46 is formed which extends between the inner side walls 47, 48 of the first gate electrode 26 and second gate electrode 27, respectively, exposing them within the trench 12. The lower portion 49, 50 of the inner side walls 47, 48 of the first gate electrode 26 and second gate electrode 27 is overlapped by and covered by the remaining spacer 40. The uppermost surface 44 of the spacer 40 is now arranged between the first gate electrode 26 and the second gate electrode 27 within the trench 12.

In this embodiment, the spacer 40 is selectively removed by selective etching. Selective etching is performed by etching the area of the trench 12 exposed in the through-hole 42 by an etch substance which removes the material of the spacer 40, in this embodiment $Si_3N_4$, at a faster rate than the material of the gate electrode 26, 27, in this embodiment, polysilicon, and at a faster rate than the material of the dielectric layers 22, 23. In particular, the difference in the etching rate may be in the range of 1.5:1 to 100:1. A suitable etch for this combination of materials is a hot phosphor etch.

As is illustrated in FIG. 6, an electrically conductive material is then deposited into the open end 43 of the trench 12 to form a contact to the gate electrode 26, 27. More particularly, the electrically conductive material fills the shallow trench 46 formed by selective removal of the spacer 40 so as to be in direct physical contact as well as electrical contact to the first gate electrode 26 and second gate electrode 27. The through hole 42 formed in the first dielectric layer 22 and second dielectric layer 23 above the trench 12 is also filled by the electrically conductive material and an electrically conductive layer 34 is also formed on the upper surface 32 of the intermediate oxide layer 23 to provide a surface gate contact 31.

Furthermore, the omission of the gate polysilicon cover enables the doping of the body region 15 to be more uniform since the shadowing effect of the gate polysilicon island, which can occur to a noticeable degree if the width $w_m$ as shown in FIG. 12 of the mesa 20 is small, can be avoided. The width $w_m$ as shown in FIG. 12 of the mesa 20 and, therefore, the integration density of the semiconductor device can be increased.

Additionally, the omission of the gate polysilicon island results in a more planar topography being produced after the trench is filled by the oxides covering and burying the gate electrode 26, 27 within the trench 12. A first dielectric layer 22 including phosphate silicon glass (PSG) rather than a boron phosphate silicon glass (BPSG) can be used so that a melting process, typically used to obtain a planar topography for the BPSG layer can be avoided, simplifying the production.

In FIGS. 4 to 6, the drain metallization 17 shown in FIG. 1A on the rear side of the semiconductor device 10 has not yet been applied. In some embodiments, the rear side 51 of the semiconductor device 10 is ground to reduce the thickness and the drain metallization applied after the processing of the opposing side is complete. In other embodiments, the drain metallization 17 shown in FIG. 1A is applied to the rear side 51 before processing of the opposing side, for example the production of the surface source contact 36 shown in FIG. 2 and surface gate contact 31 is carried out.

The material of the spacer 40 is selected so as to be selectively removable, for example by etching, over the material of the first gate electrode 26 and second gate electrode 27 by a factor in the range of 1.5:1 to 100:1. The material of the intermediate oxide 23 and electrically insulating material 29 lining the side walls 18, 19 of the trench 12 may also be selected so as to be selectively removable, for example by etching, over the material of the spacer 40 by a factor in the range of 1.5:1 to 100:1.

If the first gate electrode 26 and second gate electrode 27 include poysilicon and the spacer 40 includes $Si_3N_4$, a hot phosphor etch can be used to selectively remove the $Si_3N_4$ spacer so as to produce the shallow trench 46 with the desired depth whilst leaving the polysilicon gate electrodes 26, 27 largely unaffected.

FIGS. 7 to 9 illustrate an embodiment in which at least one gate electrode 26, 27 positioned in the upper portion 28 of the trench 12 is also fabricated using a selective removal method.

FIG. 7 illustrates a semiconductor substrate 11 including a trench 12. The side walls 18, 19 of the trench 12 are lined with an electrically insulating field oxide 29. A buried insulated source electrode 24 is arranged in the bottom portion 25 of the trench 12. The trench 12 further includes a spacer 40 extending from the buried insulated source electrode 24 to the open end 43 of the trench 12.

The field oxide 29 in the upper portion 28 of the trench 12 is selectively removed over the material of the spacer 40, in this embodiment, silicon nitride, and the silicon of the mesa 20 shown in FIG. 1A to create at least one shallow trench in the field oxide 29 whilst leaving the spacer 40 and the silicon largely unetched. In the embodiment of FIG. 7, the oxide 29 is selectively removed to provide two shallow trenches 52, 53 arranged on opposing sides of the spacer 40 which abut the opposing side walls of the spacer 40. The trenches 52, 53 extend in the long direction of the trench 12. The oxide 29 may be selectively removed by selective etching, the selectivity of oxide over silicon nitride and silicon being in the range of 10:1 to 1000:1. The gate oxide layer 54 is then grown on the side walls of the trench 12 exposed in the shallow trenches 52, 53.

FIG. 8 illustrates the deposition of polysilicon into the upper portion of the shallow trenches 52, 53 to form two gate electrodes 26, 27 arranged in an upper portion of the trench 12. The polysilicon of the gate electrodes 26, 27 is selectively etched to from the gate poly recess. The etch selectivity of polysilicon over silicon nitride may in the range of 2:1 to 10:1. The polysilicon is then oxidized to form dielectric layer 58. The spacer 40 still extends to the open end 43 of the trench 12 and is exposed in the open end 43 of the trench 12.

FIG. 9 illustrates the deposition of TEOS layer 22 onto the dielectric layer 58 followed by the deposition of intermediate oxide layer 23.

If the spacer 40' includes an electrically conductive material, a dielectric layer 41 is deposited on the buried insulated source electrode 24 and afterwards the spacer 40' is deposited on the dielectric layer 41. The dielectric layer 41 may be an oxide or $Si_3N_4$, for example. This dielectric layer 41 provides electrical insulation of the buried insulated source electrode 24 from the electrically conductive spacer 40' and also from the first gate electrode 26, second gate electrode 27 and surface gate contact 31.

After the production of the first gate electrode 26 and second gate electrode 27 in the upper portion 28 of the trench 12 and deposition of the dielectric layers 22, 23 illustrated in FIGS. 7 to 9, the method of the embodiment illustrated in FIGS. 4 to 6 may be carried out to produce the semiconductor device 10 illustrated in FIG. 1.

The surface source electrode 36 and the surface gate electrode 31 may both be self-aligned contacts. This enables the surface source electrode 36 and the surface gate electrode 31 to be arranged in the same rewiring level. The surface source electrode 36 and the surface gate electrode 31 may be produced using the same process and at the same time since they are positioned in the same layer. The number of processing steps can be reduced over those required to produce a device in which the surface source contact and the surface gate contact are arranged in different layers of the metallization or rewiring structure. Furthermore, additional electrical insulation layers to electrically insulate the surface source contact layer from the underlying surface gate contact layer or vice versa can be omitted.

Figure 10:
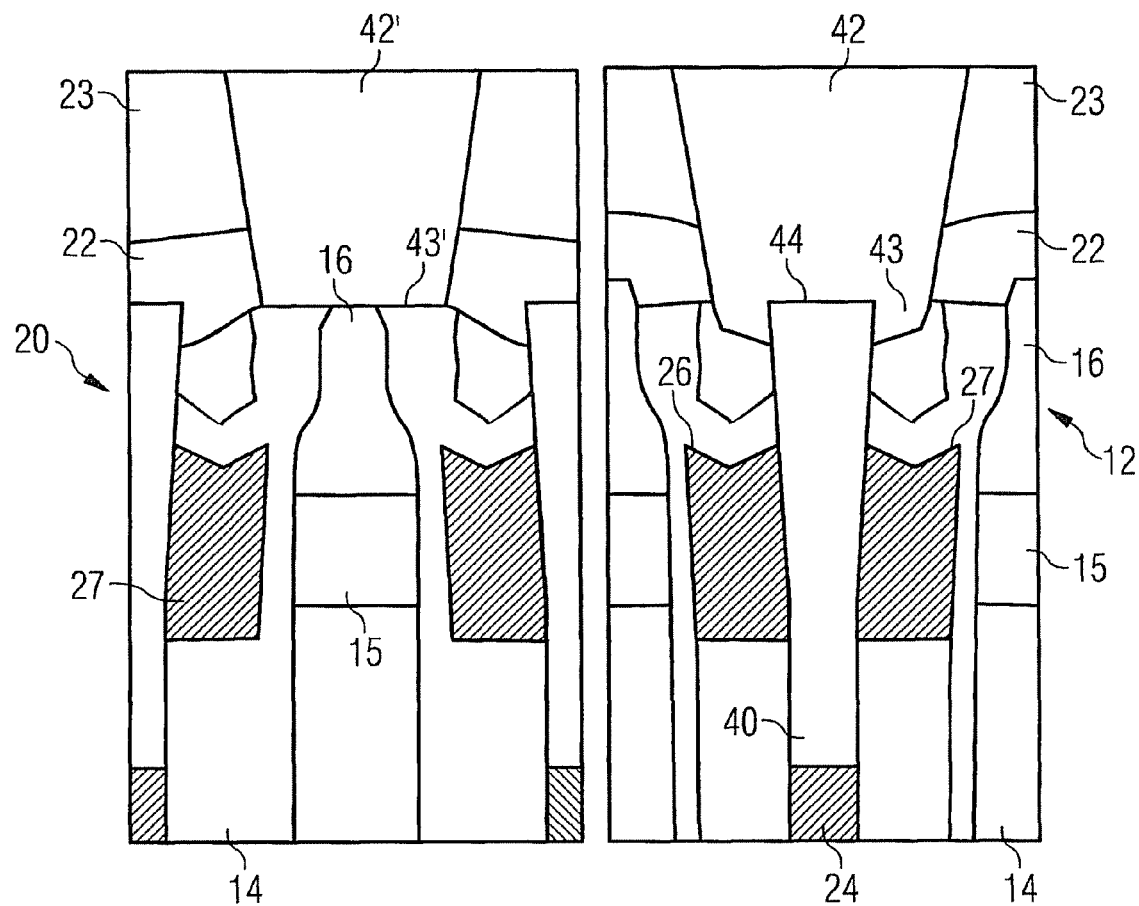
FIGS. 10 to 12 illustrate the fabrication of a self-aligned source contact and a self-aligned gate contact.
Figure 11:
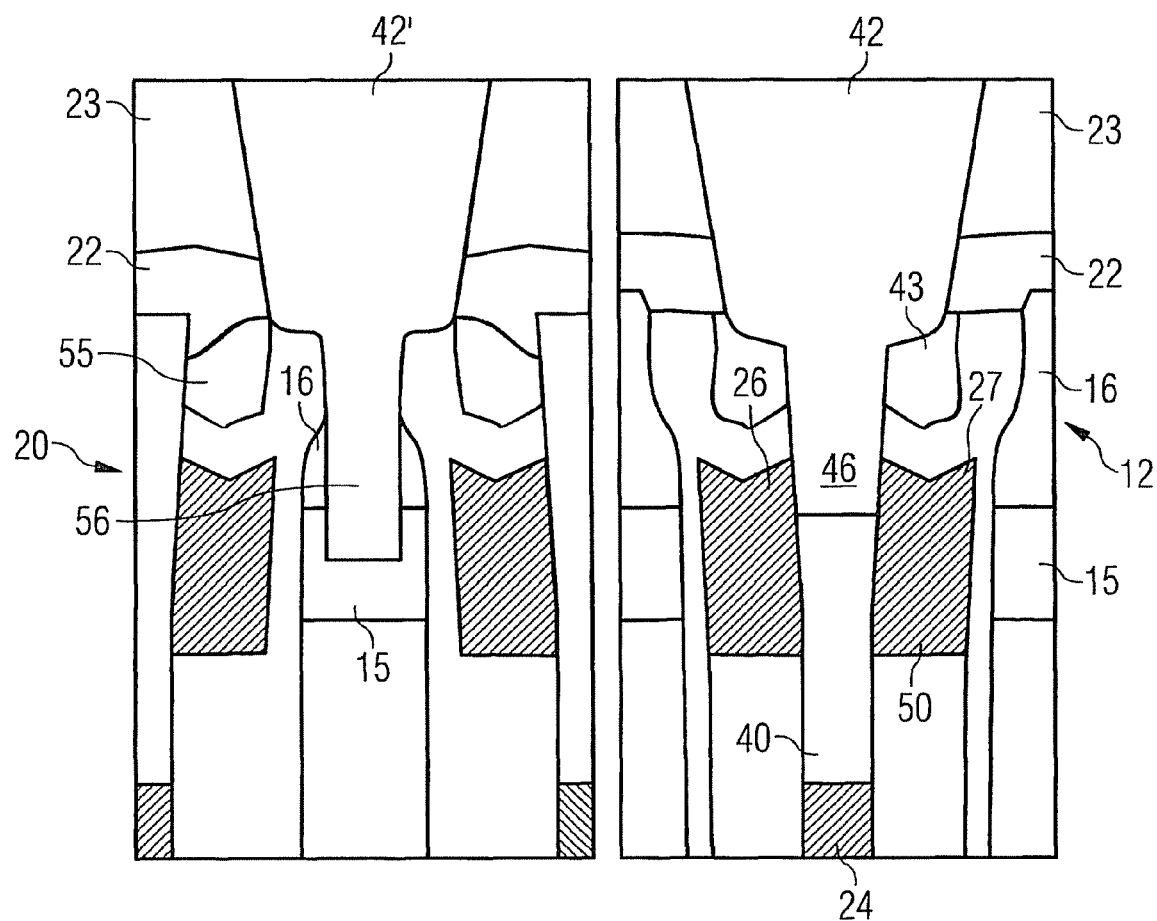

A method of producing the surface source contact 36 and the surface gate contact 31 using the same process steps is illustrated in FIGS. 10 to 12. In each of these Figures, the left hand portion illustrates a mesa 20 and the right hand portion illustrates a trench 12. The left hand portion illustrates the production of a portion of the surface source contact 36, in particular its connection to the body region 15 of the mesa 20. The right hand portion of FIGS. 10 to 12 is not laterally adjacent the respective left hand portion of FIGS. 10 to 12 in the semiconductor device 10 itself but illustrates a cross-sectional view of the same trench 12 and mesa 20 as the left hand portion but at a different position along the length of the trench 12 and mesa 20.

The surface gate contact 31 and the surface source contact 36 are arranged adjacent one another on the front side of the semiconductor device. Typically, the surface source contact 36 covers the majority of the area of the front side 32 and the surface gate contact 31 is positioned in defined region, typically in one corner and/or may further include a gate runner arranged in one or more peripheral edge regions.

FIG. 10 illustrates the production of a through hole 42' in the first dielectric layer 22 and second dielectric layer 23 above the mesa 20 for producing the self aligned source contact 36 shown in FIG. 12 to the body positioned in the mesa 20, as illustrated in the left hand portion of FIG. 10, as well as a through-hole 42 in the first electric layer 22 and second dielectric layer 23 positioned above the trench 12 for producing the self aligned gate contact 31 shown in FIG. 12 to the first gate electrode 26 and second gate electrode 27 positioned in the upper region 28 of the trench 12, as illustrated in the right hand portion of FIG. 10.

In both cases, the intermediate oxide layer 23, underlying dielectric layer 22 as well as at least the uppermost portion of the TEOS 55 shown in FIG. 11 is removed to produce a through hole 42, 42'. The uppermost portion 44 of the spacer 40 is exposed in the base 43 of the through hole 42 in the trench 12 and the uppermost portion of the source layer 16 is exposed in, and forms the base 43' of, the though-hole 42' positioned on the mesa 20.

FIG. 11 illustrates an etching process in which the uppermost portion of the spacer 40 is selectively removed over the oxide layer 29 shown in FIG. 1A/1B in the trench 12 and first gate electrode 26 and second gate electrode 27 so as to produce a shallow trench 46 in which the uppermost region of the inner side walls of the first gate electrode 26 and second gate electrode 27 are exposed. The same etching process produces a shallow trench 56 in the mesa 20 which extends through the source region 16 and into the body region 15 so that a region of the body region 15 is exposed in the bottom of the shallow trench 56.

FIG. 12 illustrates the deposition of an electrically conductive material 57 into the shallow trenches 46, 56 formed by the selective etching process illustrated in FIG. 11. This electrically conductive material 57 is in physical contact as well as electrical contact with the body region 15 arranged in the mesa 20 and with the first gate electrode 26 and second electrode 27 arranged in the trench 12.

The electrically conductive material 57 may, as previously described, be polysilicon and or may have multilayer stack structure. As an example, a first layer of titanium may be used, a second layer of titanium nitrate may be deposited on the titanium and a third layer of tungsten may be deposited on the titanium nitride. Aluminium-copper may be deposited on top of the tungsten.

The electrically conductive material 57 may be selectively deposited so that a laterally separate surface gate contact 31 and surface source contact 36 are formed on the front side 32 which are electrically insulated from one another. Alternatively, a single closed electrically conductive layer may be formed on the front side 32 which is subsequently patterned to define and electrically insulate the surface gate contact 31 and the surface source contact 36 from one another.

Figure 13:
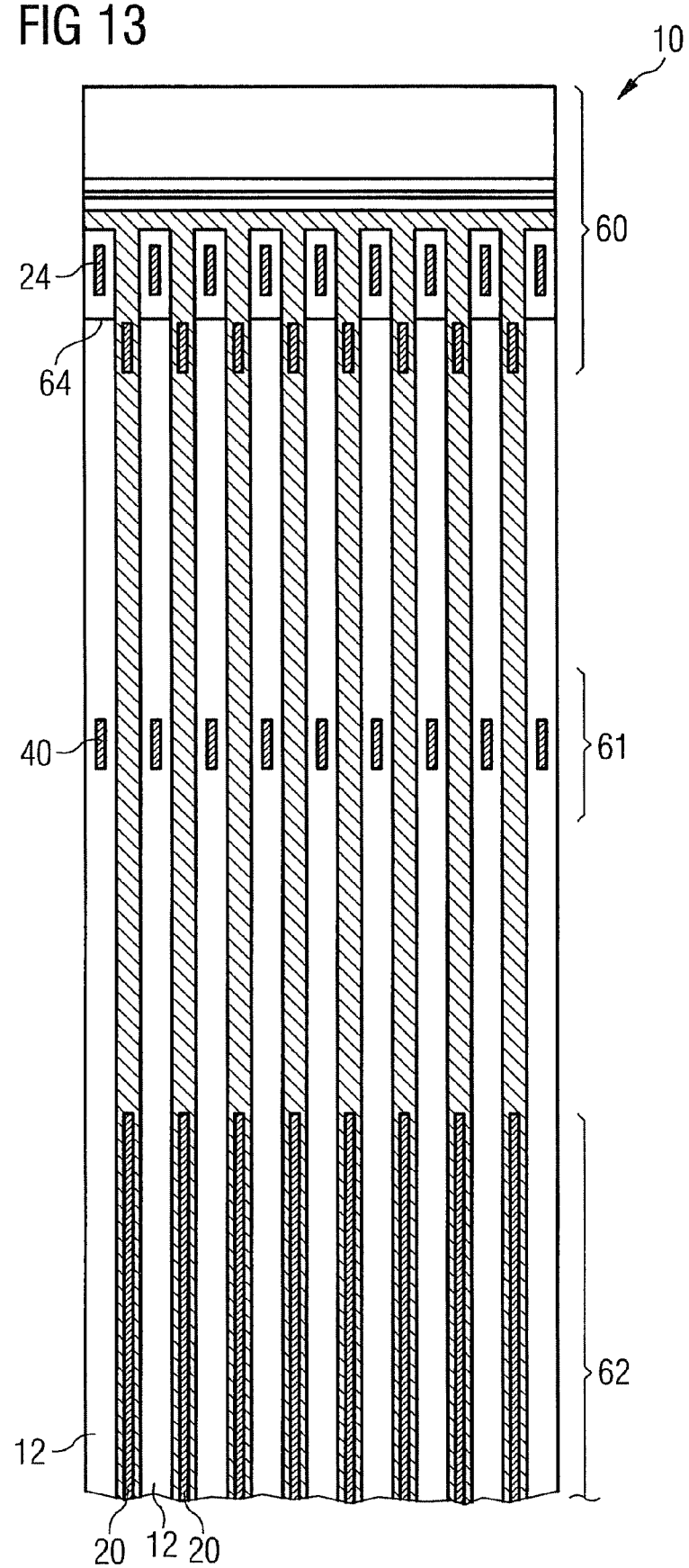

FIG. 13 illustrates a plan view of the semiconductor component 10 and illustrates the contacting arrangements for a plurality of trenches 12 separated by mesas 20.

Region 60 indicates the region of one end of the plurality of trenches 12 in which the buried source electrode 24 is electrically connected to a source finger 36. Region 60 corresponds to the cross-sectional view of FIG. 2.

Region 61 indicates a portion of the trench in which the gate electrodes 26, 27 are electrically connected to a surface gate finger 31. Region 61 corresponds to the cross-sectional views of FIG. 1A and FIG. 1B.

Region 62 indicates a portion of the plurality of trenches 12 in which the body region 15 of the mesa 20 is connected to a surface source contact 36, in particular a source pad. Region 62 corresponds to the left hand portion of FIGS. 10 to 12.

The gate electrodes 26 and 27 extend in the trenches 12 to a point indicated with the line 64 in FIG. 13. The line 64 indicates the edge of the gate oxide region of the trenches 12.

FIGS. 14 to 18 illustrate cross-sectional views of the fabrication of a surface contact in each of the regions 60, 61 and 62. In FIGS. 14 to 18, a cross-sectional view of region 60 is illustrated in the right-hand portion, the cross-sectional view of region 61 is illustrated in the left-hand portion and a cross-sectional view of regional 62 is illustrated in the centre portion of each of the drawings.

FIG. 14 illustrates the etching of a contact hole 42, 42', 42" using a photoresist mask 63 positioned on the intermediate oxide layer 23. The contact hole 42 exposes the uppermost region of the spacer 40 in the trench 12 in region 61. The contact hole 42' exposes the uppermost portion of the mesa 20 in region 62. The contact hole 42" exposes the uppermost portion of the buried source electrode 24 in the trench 12 in region 60.

The photoresist layer 63 is then removed and the contact holes 42, 42' and 42" partially etched as illustrated in FIG. 15. The etching rate of silicon is slightly greater than the etching rate of silicon nitride so that a trench 56 is formed in the uppermost region of the mesa 20 in region 62 and the uppermost portion of the buried source electrode 24 in region 60 is removed whilst the silicon nitride spacer 40 in region 61 remains largely unaffected.

FIG. 16 illustrates the deposition of nitride and implantation of the body region 15 and source region 16 of the mesa 20.

FIG. 17 illustrates the selective removal of the spacer 40 in region 61 of the trench 12. A hot phosphor acid etch may be used which selectively etches silicon nitride over polysilicon at a rate of between 5:1 and 100:1. Therefore, the silicon nitride spacer 40 in the region 61 is etched faster than the polysilicon of the buried source electrode 24 in region 60 and the source region 15 of the mesa 20 of region 62. The spacer 40 is etched until the uppermost region 33 of the gate electrodes 26, 27 is exposed.

FIG. 18 illustrates a further etch in which a trench 56 in the mesa 20 is formed which has a base positioned in the body region 15. A contact layer is then deposited into the trenches 42, 42' and 42" to form a contact to the gate electrodes 26,27 in region 61, a contact to the body region 15 in the mesa 20 in region 62 and a contact to the buried source electrode 24 in region 60 of the semiconductor component 10. The contact layer may then be structured so as to electrically isolate the surface gate contact 31 from the surface source contact 36.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor substrate;
   a trench;
   a buried insulated source electrode arranged in a bottom portion of the trench;
   first and second gate electrodes arranged in an upper portion of the trench and spaced apart from one another; and
   a surface gate contact extending into the upper portion of the trench and being in physical and electrical contact with the first and second gate electrodes, the surface gate contact providing a through contact portion which extends through an intermediate oxide layer into the trench,
   wherein the trench further includes a spacer extending from the buried insulated source electrode to the surface gate contact, the spacer comprising sidewalls perpendicular to the semiconductor substrate, the sidewalls extending between the buried insulated source electrode and the first and second gate electrodes,
   wherein the spacer overlaps lower regions of the first and second gate electrodes and fills all the space directly between the lower regions of the first and second gate electrodes,
   wherein the buried insulated source electrode is arranged entirely below the first and second gate electrodes, and
   wherein the spacer consists of $Si_3N_4$ and is in physical contact with the buried insulated source electrode, the first and second gate electrodes, the surface gate contact, and an electrically insulating material of a material different from $Si_3N_4$ arranged on side walls of the trench.

2. The semiconductor device of claim 1, wherein in regions of the trench adjacent the surface gate contact, an upper portion of the buried insulated source electrode is arranged between, and electrically insulated from, the first and second gate electrodes.

3. The semiconductor device of claim 1, wherein the trench has a depth and a gate oxide region, the first and second gate electrodes extending along substantially the entire gate oxide region of the trench.

4. The semiconductor device of claim 1, wherein the surface gate contact extends between the first and second gate electrodes.

5. The semiconductor device of claim 1, further comprising a surface source contact electrically connected to the buried insulated source electrode.

6. The semiconductor device of claim 5, wherein the surface gate contact and the surface source contact are arranged in a same rewiring level having a number of electrically conductive layers separated by insulating layers.

7. The semiconductor device of claim 1, wherein the $Si_3N_4$ is selectively etchable over a conductive material of the first and second gate electrodes by a factor of 1.5:1 to 100:1.

8. The semiconductor device of claim 1, further comprising:
   a body region lateral to the first and second gate electrodes,
   wherein the first and second gate electrodes extend vertically above and below the body region.

9. A semiconductor device, comprising:
   a semiconductor substrate including a plurality of semiconductor mesas therein that are separated by a plurality of trenches that extend in parallel and lengthwise across the substrate, each of the plurality of semiconductor mesas including at least one body region and at least one source region;
   a plurality of buried insulated source electrodes extending lengthwise in the plurality of trenches and arranged in a lower portion of the trenches;
   first and second gate electrodes arranged in an upper portion of the trenches spaced apart from one another;
   a surface gate contact extending into the upper portion of the trenches and being in contact with the first and second gate electrodes;
   a surface source contact electrically connected to the plurality of buried insulated source electrodes and to the at least one body region of the mesas; and
   the surface gate contact and the surface source contact being arranged in a same rewiring level having a number of electrically conductive layers separated by dielectric layers,
   wherein the trenches further include spacers extending from the buried insulated source electrodes to the surface gate contact, each spacer filling all the space directly between lower regions of the first and second gate electrodes,
   wherein each buried insulated source electrode is arranged entirely below the first and second gate electrodes, and wherein each spacer of each trench consists of $Si_3N_4$ and is in physical contact with each buried insulated source electrode, the first and second gate electrodes, the surface gate contact, and an electrically insulating material of another material different from $Si_3N_4$ arranged on side walls of each trench.

10. The semiconductor device of claim 9, wherein each spacer overlaps the lower regions of the first and second gate electrodes.

11. The semiconductor device of claim 9, wherein the $Si_3N_4$ is selectively etchable over a conductive material of the first and second gate electrodes by a factor of 1.5:1 to 100:1.

12. The semiconductor device of claim 9, wherein the first and second gate electrodes extend vertically above and below the at least one body region.

13. The semiconductor device of claim 9, wherein the first and second gate electrodes laterally overlap the at least one source region.

* * * * *